United States Patent
Chandrasekharan et al.

(10) Patent No.: US 12,186,851 B2
(45) Date of Patent: Jan. 7, 2025

(54) USE OF VACUUM DURING TRANSFER OF SUBSTRATES

(71) Applicant: LAM RESEARCH CORPORATION, Fremont, CA (US)

(72) Inventors: Ramesh Chandrasekharan, Lake Oswego, OR (US); Michael Philip Roberts, Tigard, OR (US); Paul Konkola, West Linn, OR (US); Michael G. R. Smith, West Linn, OR (US); Brian Joseph Williams, Tigard, OR (US); Ravi Kumar, Beaverton, OR (US); Pulkit Agarwal, Beaverton, OR (US); Adrien Lavoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 389 days.

(21) Appl. No.: 17/619,420

(22) PCT Filed: Jun. 16, 2020

(86) PCT No.: PCT/US2020/037858
§ 371 (c)(1),
(2) Date: Dec. 15, 2021

(87) PCT Pub. No.: WO2020/257147
PCT Pub. Date: Dec. 24, 2020

(65) Prior Publication Data
US 2022/0305601 A1      Sep. 29, 2022

Related U.S. Application Data

(60) Provisional application No. 62/863,564, filed on Jun. 19, 2019.

(51) Int. Cl.
*B23Q 3/00* (2006.01)
*B23Q 3/08* (2006.01)
*B25B 11/00* (2006.01)

(52) U.S. Cl.
CPC ............ *B23Q 3/088* (2013.01); *B25B 11/005* (2013.01); *B23Q 2703/04* (2013.01)

(58) Field of Classification Search
CPC ......... B25B 11/00; B25B 11/005; B23Q 3/00; B23Q 3/088
See application file for complete search history.

(56) References Cited

U.S. PATENT DOCUMENTS 4,733,453 A * 3/1988 Jacoby ................... H01R 43/20
  165/185
5,562,947 A   10/1996 White et al.
(Continued)

FOREIGN PATENT DOCUMENTS

CN       1605125 A    4/2005
CN     104795344 A    7/2015
(Continued)

OTHER PUBLICATIONS

Office Action issued in corresponding Chinese Patent Application 202080045294.3 dated Oct. 23, 2023.
(Continued)

*Primary Examiner* — Lee D Wilson

(57) ABSTRACT

A method for evacuating a volume below a substrate in a substrate processing system includes arranging the substrate on a lift mechanism of a substrate support to define the volume below the substrate between the substrate and an upper surface of the substrate support. An evacuation step is initiated to evacuate the volume below the substrate. The evacuation step includes pumping down the volume below the substrate at least one of through and around the lift mechanism. The lift mechanism is lowered during the (Continued)

evacuation step to position the substrate on the upper surface of the substrate support and the evacuation step is terminated.

23 Claims, 7 Drawing Sheets

(56) References Cited

U.S. PATENT DOCUMENTS

| | | | |
|---|---|---|---|
| 11,107,698 B2* | 8/2021 | Nakayama | H01L 21/67103 |
| 2018/0230598 A1* | 8/2018 | Tanaka | H01L 21/67178 |
| 2018/0323098 A1 | 11/2018 | Konkola et al. | |
| 2020/0309452 A1* | 10/2020 | Lee | H01L 21/67034 |
| 2021/0134605 A1* | 5/2021 | Nakayama | H01L 21/67103 |
| 2022/0161396 A1* | 5/2022 | Ahamed | B25B 11/005 |
| 2022/0305601 A1* | 9/2022 | Chandrasekharan | B25B 11/005 |
| 2023/0110011 A1* | 4/2023 | Sumi | G03F 7/70783 438/14 |

FOREIGN PATENT DOCUMENTS

| | | |
|---|---|---|
| CN | 106154607 A | 11/2016 |
| CN | 107743597 A | 2/2018 |
| JP | H11297789 A | 10/1999 |
| JP | 2002057209 A | 2/2002 |
| JP | 2009032915 A | 2/2009 |
| JP | 2011035301 A | 2/2011 |
| KR | 1020080044417 A | 5/2008 |
| KR | 20110090317 A | 8/2011 |
| KR | 1020110090317 A | 8/2011 |
| KR | 1020190056188 A | 5/2019 |

OTHER PUBLICATIONS

International Search Report and Written Opinion of the ISA issued in PCT/US2020/037858, mailed Sep. 15, 2020; ISA/KR.
Office Action issued in corresponding Chinese Patent Application 2020800452943 dated May 22, 2024.

* cited by examiner

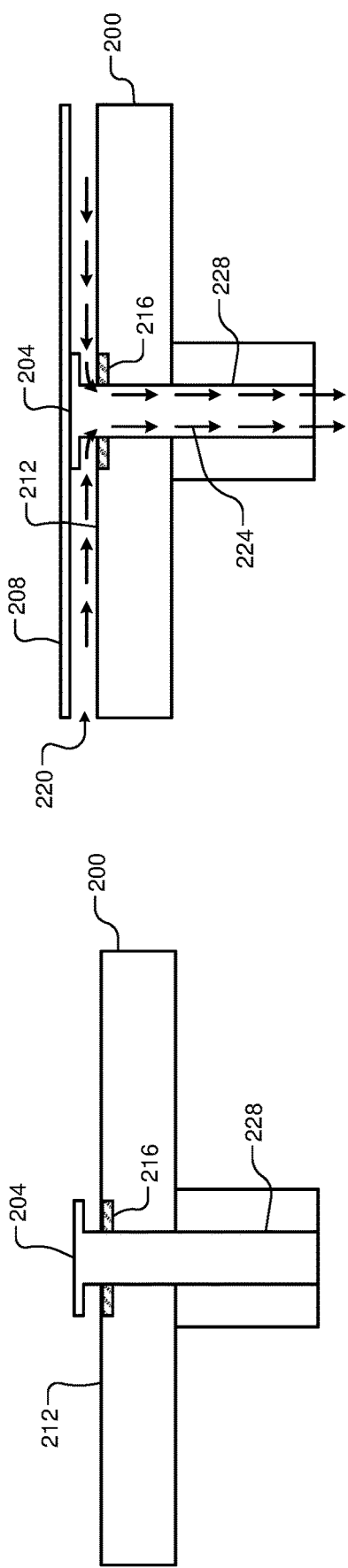
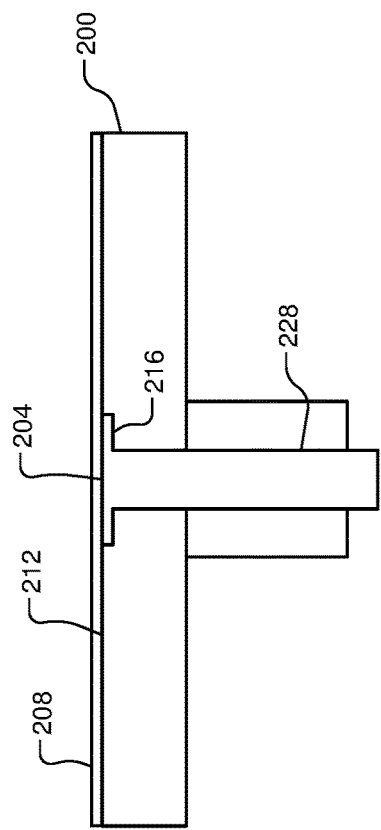

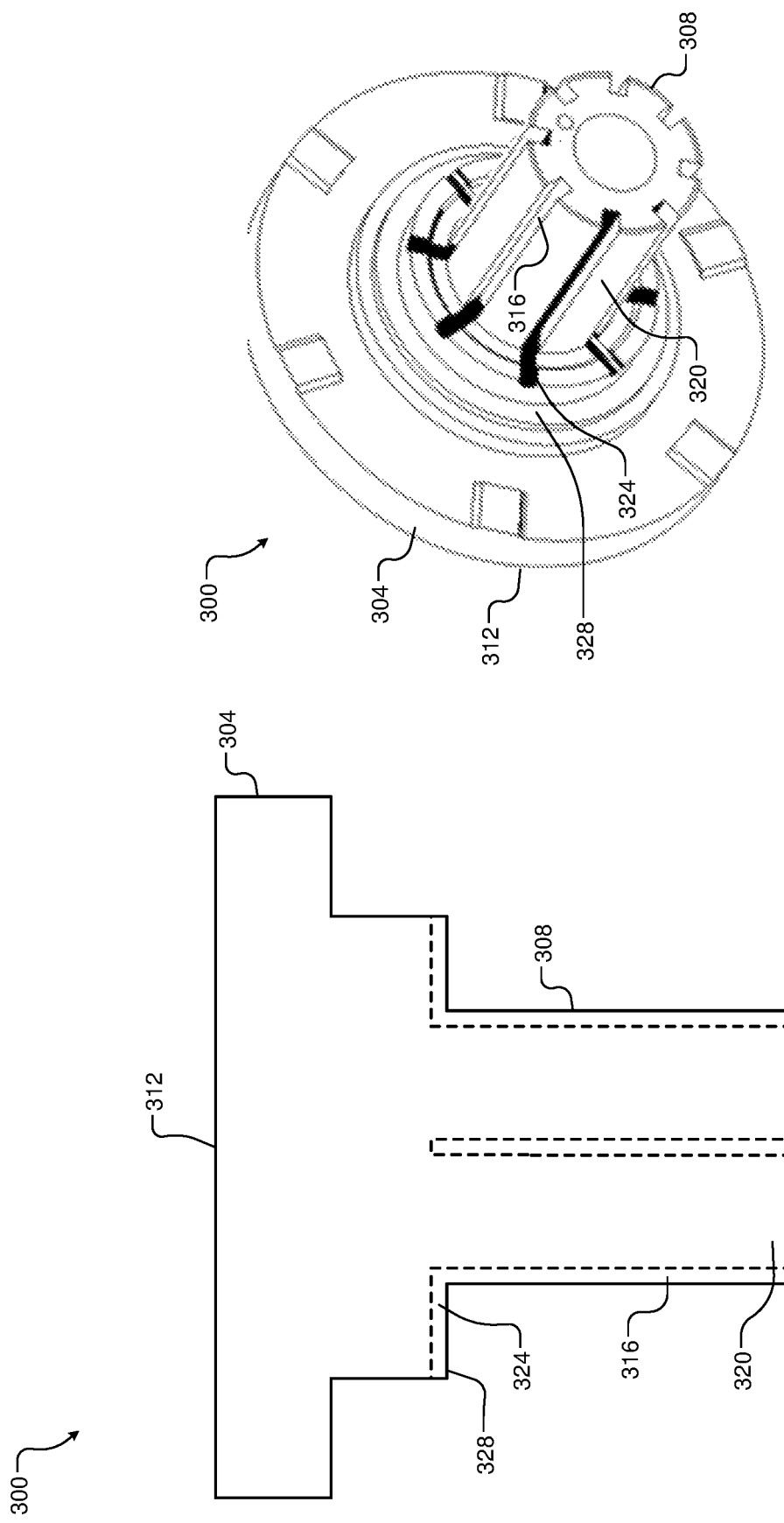

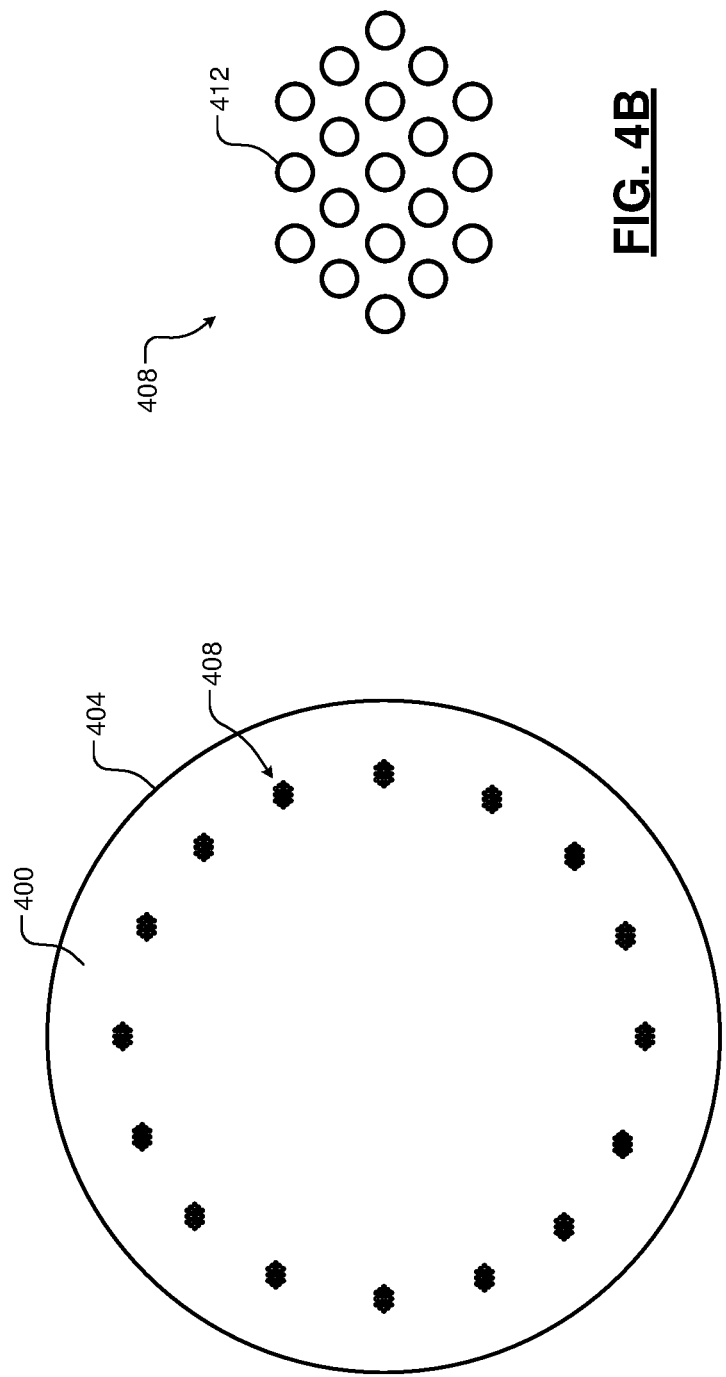

USE OF VACUUM DURING TRANSFER OF SUBSTRATES

CROSS-REFERENCE TO RELATED APPLICATIONS

This application is a U.S. National Phase Application under 35 U.S.C. 371 of International Application No. PCT/US2020/037858, filed on Jun. 16, 2020, which claims the benefit of U.S. Provisional Application No. 62/863,564, filed on Jun. 19, 2019. The entire disclosures of the applications referenced above are incorporated herein by reference.

FIELD

The present disclosure relates to transferring substrates, such as semiconductor wafers, to substrate supports in substrate processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Examples of substrate treatments include etching, deposition, photoresist removal, etc. During processing, the substrate is arranged on a substrate support such as an electrostatic chuck and one or more process gases may be introduced into the processing chamber.

The one or more processing gases may be delivered by a gas delivery system to the processing chamber. In some systems, the gas delivery system includes a manifold connected by one or more conduits to a showerhead that is located in the processing chamber. In some examples, deposition processes such as chemical vapor deposition (CVD), plasma enhanced CVD (PECVD), atomic layer deposition (ALD), etc. are used to deposit material on a substrate. In other examples, chemical and/or plasma enhanced processes are used to etch a substrate. Various alternating etching and deposition cycles may be performed on a same substrate.

SUMMARY

A method for evacuating a volume below a substrate in a substrate processing system includes arranging the substrate on a lift mechanism of a substrate support to define the volume below the substrate between the substrate and an upper surface of the substrate support. An evacuation step is initiated to evacuate the volume below the substrate. The evacuation step includes pumping down the volume below the substrate at least one of through and around the lift mechanism. The lift mechanism is lowered during the evacuation step to position the substrate on the upper surface of the substrate support and the evacuation step is terminated.

In other features, the evacuation step is initiated in response to one of (i) the substrate being arranged on the lift mechanism and (ii) a beginning of the lowering of the lift mechanism. The evacuation step is initiated subsequent to the substrate being arranged on the lift mechanism and prior to a beginning of the lowering of the lift mechanism. The evacuation step and the lowering of the lift mechanism are initiated concurrently. The evacuation step is terminated in response to the lift mechanism reaching a fully lowered position. The evacuation step is terminated prior to the lift mechanism reaching a fully lowered position.

In other features, the lift mechanism includes at least one channel defined in a shaft of the lift mechanism and pumping down the volume below the substrate includes evacuating the volume through the at least one channel and downward through the substrate support. The at least one channel includes a plurality of channels distributed around an outer perimeter of the shaft. Each of the plurality of channels includes a vertical portion and a radial portion defined in a lower surface of the lift mechanism.

In other features, the lift mechanism includes at least one fluid passage defined in an upper surface of the lift mechanism and pumping down the volume below the substrate includes evacuating the volume through the at least one fluid passage and downward through the substrate support. The method further includes purging the volume below the substrate at least one of through and around the lift mechanism. The lift mechanism corresponds to one of a lift pad and lift pins.

A system for evacuating a volume below a substrate in a substrate processing system includes a substrate support and a lift mechanism. The lift mechanism is configured to be transitioned between raised and lowered positions relative to an upper surface of the substrate support and, when the substrate is arranged on the lift mechanism in the raised position, the volume below the substrate is defined between the substrate and the upper surface of the substrate support. A pump is configured to, during an evacuation step, evacuate the volume below the substrate. The evacuation step includes pumping down the volume below the substrate a least one of through and around the lift mechanism while the lift mechanism is being lowered to position the substrate on the upper surface of the substrate support. The lift mechanism corresponds to one of a lift pad and lift pins.

In other features, the pump is configured to initiate the evacuation step in response to one of (i) the substrate being arranged on the lift mechanism and (ii) a beginning of the lowering of the lift mechanism. The pump is configured to (i) initiate the evacuation step subsequent to the substrate being arranged on the lift mechanism and prior to a beginning of the lowering of the lift mechanism and (ii) terminate the evacuation step in response to the lift mechanism reaching a fully lowered position. The pump is configured to terminate the evacuation step is terminated prior to the lift mechanism reaching a fully lowered position.

In other features, the lift mechanism includes at least one channel defined in a shaft of the lift mechanism and pumping down the volume below the substrate includes evacuating the volume through the at least one channel and downward through the substrate support. The at least one channel includes a plurality of channels distributed around an outer perimeter of the shaft. Each of the plurality of channels includes a vertical portion and a radial portion defined in a lower surface of the lift mechanism.

In other features, the lift mechanism includes at least one fluid passage defined in an upper surface of the lift mechanism and pumping down the volume below the substrate includes evacuating the volume through the at least one fluid passage and downward through the substrate support. A gas delivery system is configured to purge the volume below the substrate through the lift pad.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A, 2B, and 2C show an example process for evacuating a volume below a substrate according to the present disclosure;

FIGS. 3A and 3B illustrate an example lift pad according to the present disclosure;

FIGS. 4A and 4B show an upper surface of a lift pad according to the present disclosure;

In the drawings, reference numbers may be reused to identify similar and/or identical elements.

DETAILED DESCRIPTION

Figure 1A:
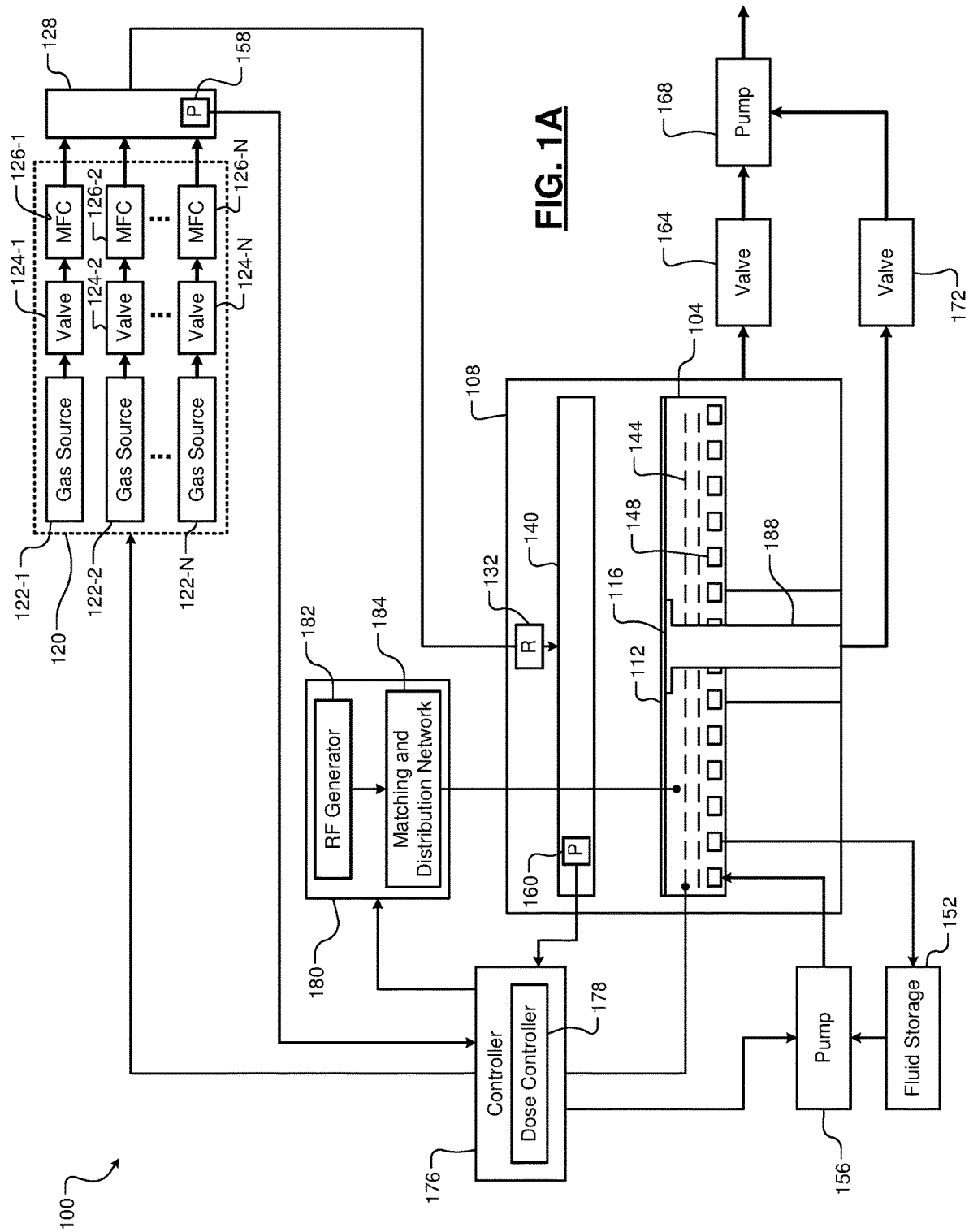
FIG. 1A is a functional block diagram of an example of a substrate processing system according to the present disclosure.

Substrates are transferred to and from a substrate support in a substrate processing chamber for treatment. For example, a robot may be used to transfer a substrate from an intermediate chamber (e.g., a buffer module, vacuum transfer module, another station in the substrate processing chamber, etc.) to the substrate support. In some examples, one or more structure features of the substrate support may be raised or otherwise repositioned to facilitate transfer and removal of the substrate. For example, the substrate support may include one or more lift pins that are raised during substrate transfer. The robot places the substrate onto the raised lift pins and then the lift pins are lowered to lower the substrate onto the substrate support.

In one example, the substrate support may include a lift pad (e.g., a centrally-located lift pad having a diameter less than a diameter of the substrate support). The lift pad is raised during substrate transfer and the substrate is placed onto the lift pad, which is subsequently lowered. In some examples (e.g., "twist pad" examples), the lift pad may be configured to rotate about a vertical center axis to adjust a rotational positon of the substrate. An example lift pad is described in more detail in U.S. Pub. No. 2018/0323098, published on Nov. 8, 2018, which is hereby incorporated herein in its entirety.

When the lift pad is lowered to position the substrate on the substrate support, gases present within the interior volume of the processing chamber may be trapped beneath the substrate (i.e., between a lower surface of the substrate and an upper surface of the substrate support. The trapped gases may cause a "hockey puck" effect where friction between the substrate and the substrate support is reduced and/or pressure caused by the trapped gases biases the substrate upward. In other words, the substrate may "float" on the upper surface of the substrate support. Accordingly, the substrate may shift (e.g., in a horizontal direction) relative to the substrate support to a non-centered position prior to and/or during processing.

In some examples, the processing chamber may be pumped down (e.g., to a vacuum pressure, such as 100 mTorr or less) prior to and/or during transfer of the substrate to the substrate support. In this manner, residual gases within the processing chamber are removed prior to the substrate being lowered into positon on the substrate support and gases are not trapped between the substrate and the substrate support.

However, in these examples, the pumping of the processing chamber down to vacuum delays processing (e.g., by 4-6 seconds) and decreases throughput accordingly.

Systems and methods according to the present disclosure pump down a volume directly below the substrate between the substrate and the substrate support while the substrate is being lowered. Accordingly, gases in the volume below the substrate are evacuated prior to being trapped between the substrate and the substrate support. For example, the lift pad may include one or more channels that provide a path from the volume directly below the substrate downward through the substrate support. In this manner, gases may be evacuated downward from below the substrate as the lift pad lowers the substrate onto the substrate support. Further, a pressure above the substrate will therefore be greater than a pressure below the substrate to bias the substrate downward and prevent the hockey puck effect and movement of the substrate.

Figure 1B:
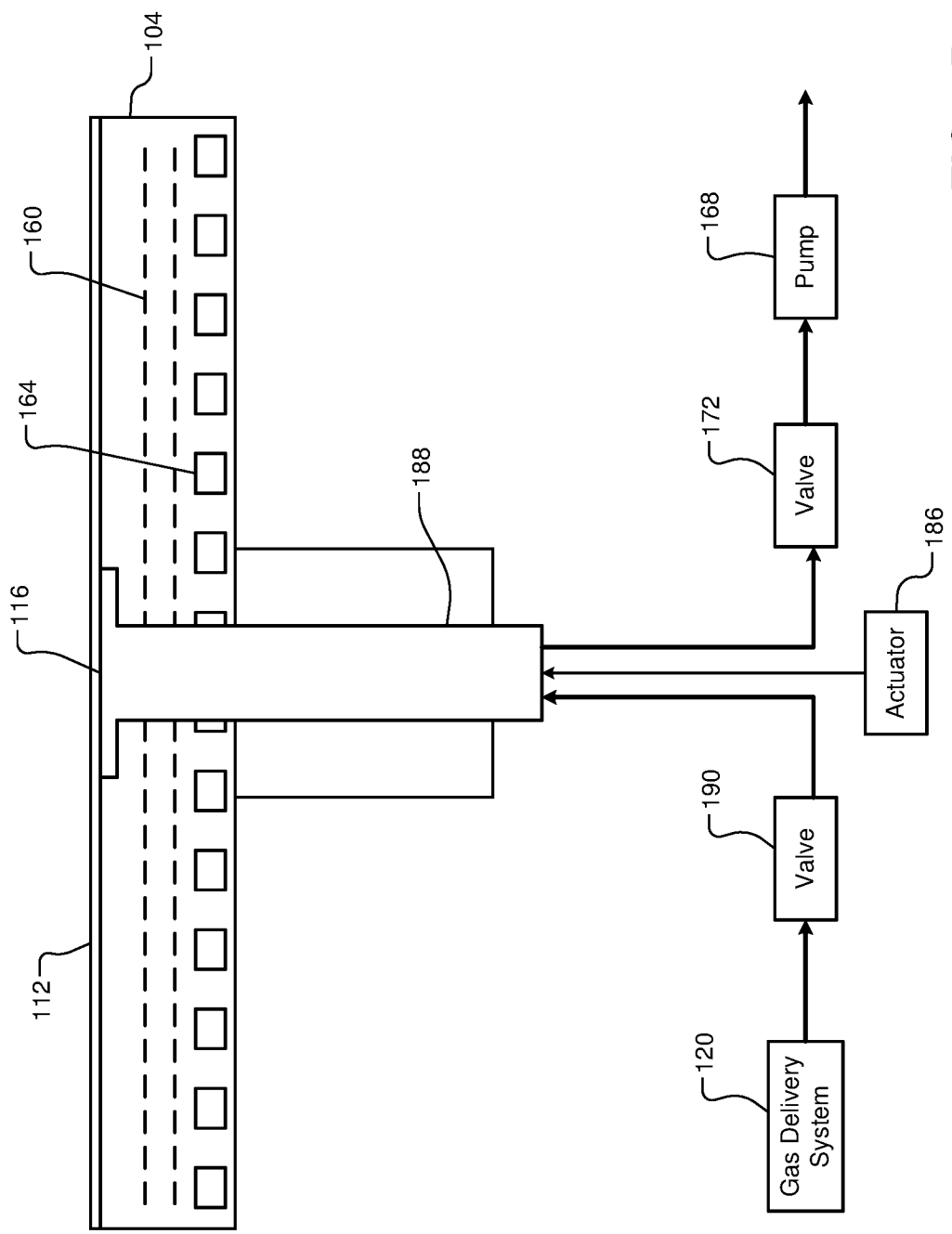
FIG. 1B is an example substrate support including a lift pad according to the present disclosure.

Referring now to FIGS. 1A and 1B, an example substrate processing system 100 including a substrate support 104 according to the principles of the present disclosure is shown. The substrate support (e.g., a pedestal) 104 is arranged within a processing chamber 108. A substrate 112 is arranged on the substrate support 104 for processing. For example, processing including deposition and etching steps may be performed on the substrate 112. The substrate support 104 may include a lift mechanism, such as a lift pad 116, configured to be raised and lowered during transfer of the substrate 112 to the substrate support 104 as described below in more detail. Although described herein as the lift pad 116, in other examples, the principles of the present disclosure may be implemented with other lift mechanisms, such as lift pins.

A gas delivery system 120 is configured to flow process gases into the processing chamber 108. For example, the gas delivery system 120 includes gas sources 122-1, 122-2, . . . , and 122-N (collectively gas sources 122) that are connected to valves 124-1, 124-2, . . . , and 124-N (collectively valves 124) and mass flow controllers 126-1, 126-2, . . . , and 126-N (collectively MFCs 126). The MFCs 126 control flow of gases from the gas sources 122 to a manifold 128 where the gases mix. An output of the manifold 128 is supplied via an optional pressure regulator 132 to a gas distribution device such as a multi-injector showerhead 140.

In some examples, a temperature of the substrate support 104 may be controlled using resistive heaters 144. The substrate support 104 may include coolant channels 148. Cooling fluid is supplied to the coolant channels 148 from a fluid storage 152 and a pump 156. Pressure sensors 158, 160 may be arranged in the manifold 128 or the showerhead 140, respectively, to measure pressure. A valve 164 and a pump 168 may be used to evacuate reactants from the processing chamber 108 and/or to control pressure within the processing chamber 108. A valve 172 and the pump 168 (or a different pump) may be used to evacuate a volume below the substrate 112 (i.e., between the substrate 112 and an upper surface of the substrate support 104) during transfer of the substrate 112 as described below in more detail.

A controller 176 controls gas delivery from the gas delivery system 120. In some examples, the controller 176 may include a dose controller 178 that controls dosing provided by the multi-injector showerhead 140. The controller 176 controls pressure in the processing chamber and/or evacuation of reactants using the valve 178 and the pump 168. The controller 176 controls the temperature of the substrate support 104 and the substrate 112 based upon temperature feedback (e.g., from sensors (not shown) in the substrate support and/or sensors (not shown) measuring coolant temperature).

In some examples, the substrate processing system 100 may be configured to perform etching (e.g., responsive to the controller 176) on the substrate 112 within the same processing chamber 108. Accordingly, the substrate processing system 100 may include an RF generating system 180 configured to generate and provide RF power (e.g., as a voltage source, current source, etc.) to one of a lower electrode (e.g., a baseplate of the substrate support 104, as shown) and an upper electrode (e.g., the showerhead 140). The other one of the lower electrode and the upper electrode may be DC grounded, AC grounded, or floating. For example only, the RF generating system 180 may include an RF generator 182 configured to generate an RF voltage that is fed by a matching and distribution network 184 to generate plasma within the processing chamber 108 to etch the substrate 112. In other examples, the plasma may be generated inductively or remotely. Although, as shown for example purposes, the RF generating system 180 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

The controller 176 according to the present controller is configured to control the valve 172 and the pump 168 to selectively evacuate the volume below the substrate 112 as described below in more detail. For example, the controller 176 may selectively raise and lower the lift pad 116 (e.g., using an actuator 186 mechanically coupled to a shaft 188 of the lift pad 116) during transfer of the substrate 112. In some examples, the controller 176 may be further configured to selectively purge the volume below the substrate 116 (e.g., using a purge gas supplied from the gas delivery system 120 and a valve 190).

FIGS. 2A, 2B, and 2C illustrate an example process for evacuating a volume below a substrate during transfer of the substrate according to the present disclosure. An example substrate support 200 includes a lift pad 204 configured to be raised and lowered as described above in FIGS. 1A and 1B. In FIG. 2A, the lift pad 204 is raised to facilitate transfer of a substrate 208 to the lift pad 204. An upper surface 212 of the substrate support 200 includes a cavity 216 arranged to receive the lift pad 204 when the lift pad 204 is lowered.

In FIG. 2A, the substrate 208 is arranged on the lift pad 204. For example, the substrate 208 may be transferred to the lift pad 204 using a robot. With the substrate 208 arranged on the lift pad 204 as shown in FIG. 2B, a volume 220 below the substrate 208 (i.e., between the substrate 208 and the upper surface 212 of the substrate support 200) is pumped down in an evacuation step to evacuate gases from the volume 220 prior to lowering the lift pad 204. For example only, the volume 220 is pumped down to a vacuum pressure of less than or equal to 100 mTorr. In some examples, the volume 220 is pumped down until a pressure differential between the volume 220 and a volume above the substrate 208 is greater than 100 mTorr. In other words, the volume 220 is pumped down until the pressure below the substrate 208 is greater than 100 mTorr less than the pressure above the substrate 208. The volume 220 is pumped down using, for example only, the pump 168 and valve 172 in response to commands from the controller 176 as described above in FIGS. 1A and 1B.

The evacuation step may begin subsequent to the substrate 208 being placed onto the lift pad 204 as the lift pad 204 is lowered. For example, the controller 176 may generate a command to pump down the volume 220 at a same time as or within a predetermined period of (e.g., within 5 ms prior to or subsequent to) generating a command to lower the lift pad 204. In some examples, the lowering of the lift pad 204 may be commanded in response to the beginning of the evacuation step or vice versa. In other examples, a same command may cause both the lowering of the lift pad 204 and the beginning of the evacuation step. In any of the examples, the evacuation step does not increase an overall amount of time required to transfer the substrate 208 to the substrate support 200 and lower the lift pad 204. Rather, the evacuation step is performed concurrently with the lowering of the lift pad 204. For example only, the lift pad 204 may be lowered to a fully lowered position in less than one second.

The lift pad 204 is shown in a lowered position (e.g., a fully lowered position) in FIG. 2C with the substrate 208 arranged on the upper surface 212 of the substrate support 200. The evacuation step (and the pumping down of the volume 220) may be terminated in response to the lift pad 204 reaching a fully lowered position, when the lift pad 204 is within a predetermined distance (e.g., 0.0-1.0 mm) of the fully lowered position, within a predetermined period (e.g., less than 1.0 ms prior to or subsequent to) of the lift pad 204 reaching the fully lowered position, etc. Accordingly, the evacuation step may be performed throughout the lowering of the lift pad 204 to maintain a vacuum within the volume 220 and prevent gases from being trapped between the substrate 208 and the upper surface 212 of the substrate support 200.

Flow paths 224 of the gases being evacuated from the volume 220 are shown in FIG. 2B. For example, the flow paths 224 correspond to respective channels (described below in more detail) defined within a shaft 228 of the lift pad 204. Although the flow paths 224 indicate a flow of gases out of the volume 220 and downward through (and/or around a perimeter of) the shaft 228 of the lift pad 204 during the evacuation step, in some examples a purge step may be performed to supply purge gases upward and into the volume 220. For example, the purge step may be performed prior to and/or subsequent to other processing steps performed on the substrate 208. In some examples, the purge gases may be supplied during processing and/or cleaning steps to prevent contamination, deposition on surfaces of the lift pad 204, plasma light up, etc. In other words, the supply of the purge gases through the lift pad 204 prevents back-diffusion of process gases and other materials into the lift pad 204 and other structures of the substrate support 200. The purge gases may be supplied with or without the substrate 208 arranged on the lift pad 204.

Referring now to FIGS. 3A and 3B and with continued reference to FIGS. 1A, 1B, 2A, 2B, and 2C, an example lift pad 300 configured to evacuate gases from (and supply purge gases to) the volume 220 is shown. The lift pad 300 includes a support pad 304 supported on a vertical shaft 308.

For example, the support pad 304 is annular and the shaft 308 is cylindrical. The support pad 304 includes a planar upper surface 312 configured to support a substrate.

The shaft 308 includes a plurality of vertical channels 316. For example, the channels 316 are defined in an outer surface 320 of the shaft 308 and are arranged in a radial pattern relative to a central axis of the shaft 308. For example only, the channels 316 are evenly spaced in the radial pattern. Although eight of the channels 316 are shown, fewer or more of the channels 316 may be provided.

Lower ends of the channels 316 are in fluid communication with valves 172 and 190, pump 168, and/or gas delivery system 120 as shown in FIG. 1B. Conversely, upper ends of the channels 316 are in fluid communication with the volume 220. For example only, the channels 316 include respective radial portions 324 defined within a lower surface 328 of the pad portion 304. The radial portions 324 extend radially outward from the shaft 308 toward the volume 220.

Referring now to FIGS. 4A and 4B, an example upper surface 400 of a lift pad 404 according to the present disclosure is shown. For example, the upper surface 400 may correspond to the upper surface 312 of the lift pad 300 as shown in FIGS. 3A and 3B. In this example, the upper surface 400 includes a plurality of fluid passages 408. As shown, the fluid passages 408 correspond to clusters of holes 412 as shown in FIG. 4B. Although each of the clusters of holes 412 is shown to include 19 holes, each of the clusters may include fewer or more of the holes 412 in other examples. In some examples, each of the fluid passages 408 may correspond to only a single one of the holes 412.

As shown, the fluid passages 408 are arranged in a circular pattern within an outer perimeter of the upper surface 400. However, in other examples, the fluid passages 408 may be arranged in a different pattern. Further, although sixteen of the fluid passages 408 are shown, other examples may include fewer or more of the fluid passages 408.

The fluid passages 408 are in fluid communication with, for example, the valves 172 and 190, the pump 168, and the gas delivery system 120. The fluid passages 408 may be provided in addition to or instead of the channels 316 as described in FIGS. 3A and 3B. The fluid passages 408 may be in fluid communication with the channels 316 such that evacuation and/or purging using the channels 316 and the fluid passages 408 are performed concurrently. In other examples, evacuation and/or purging performed with the fluid passages 308 and the channels 316 may be performed independently. Accordingly, the fluid passages 408 may be configured to evacuate the volume 220 during the evacuation step and/or supply purge gases into the volume 220 as described above.

Figure 5A:
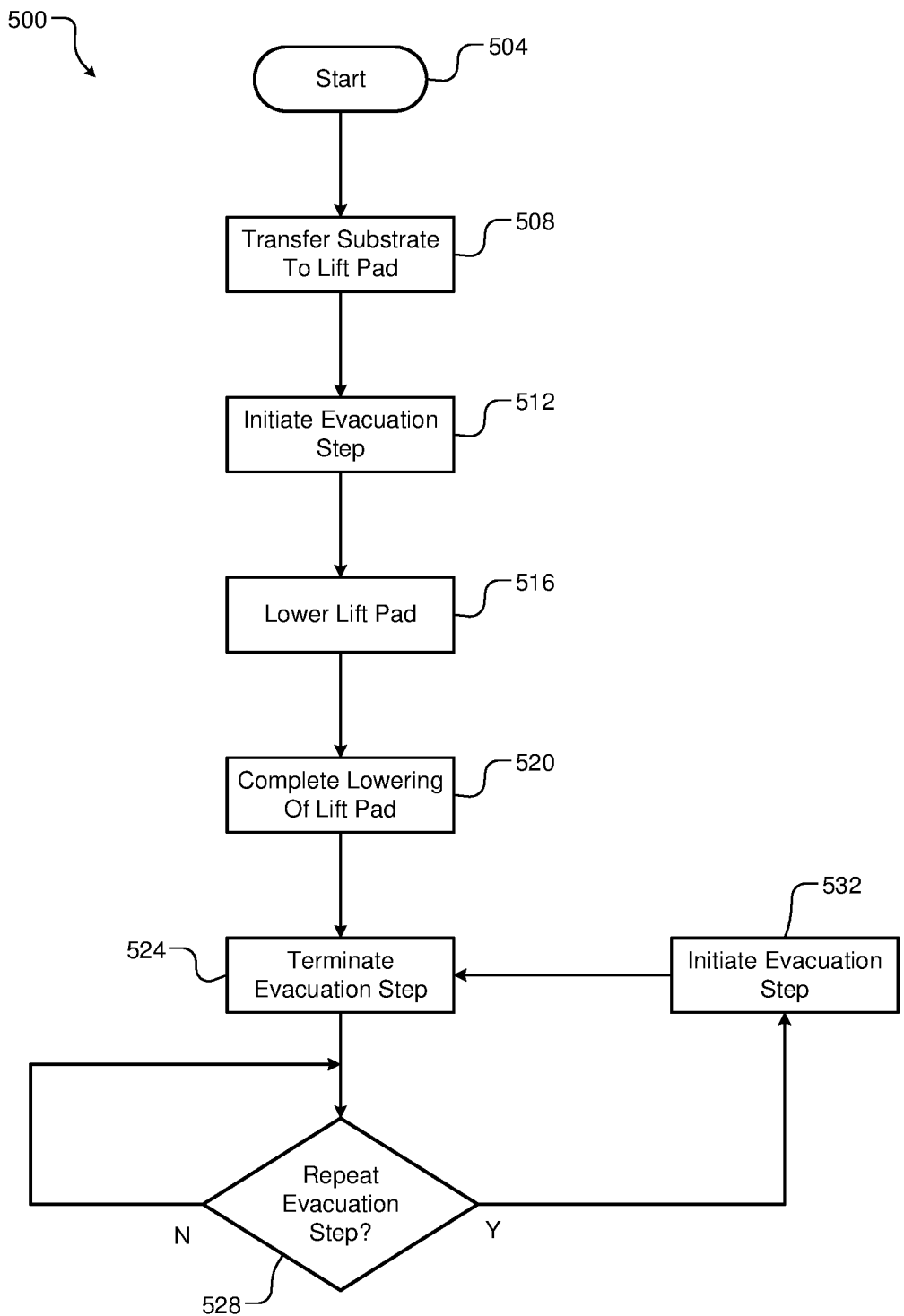
FIG. 5A shows steps of an example method for evacuating a volume between a substrate and a substrate support according to the present disclosure.

Referring now to FIG. 5A, an example method 500 for evacuating a volume between a substrate and a substrate support according to the present disclosure begins at 504. At 508, the substrate is transferred to a lift pad. At 512, an evacuation step is initiated. For example, the method 500 begins to evacuate/pump down a volume below the substrate between the substrate and the substrate support. At 516, the method 500 begins to lower the lift pad to lower the substrate onto the substrate support. Although as shown the beginning of the evacuation step at 512 occurs prior to lowering the lift pad at 516, in other examples the evacuation step 512 may be initiated subsequent to or concurrently with the beginning of the lowering of the lift pad.

At 520, the lowering of the lift pad is completed. For example, the lift pad is lowered to a fully lowered position. At 524, the method 500 terminates the evacuation of the volume between the substrate and the substrate support to end the evacuation step. Although as shown the ending of the evacuation step at 520 occurs subsequent to the lift pad reaching the fully lowered position at 520, in other examples the termination of the evacuation step may occur prior to or concurrently with the lift pad reaching the fully lowered position.

At 528, the method 500 determines whether to repeat the evacuation step. For example, the evacuation step may be selectively repeated periodically throughout processing to reestablish a desired pressure or vacuum in the volume below the substrate. If true, the method 500 performs an additional evacuation step at 532.

Figure 5B:
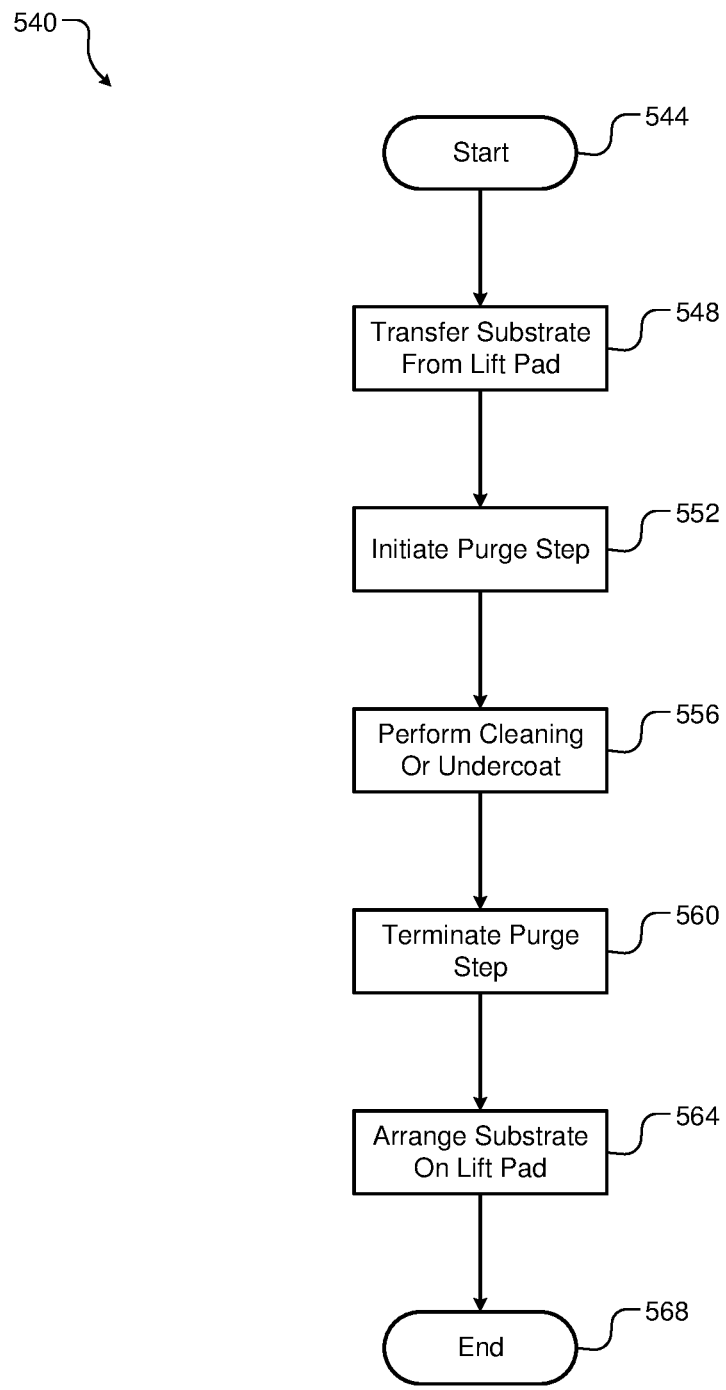
FIG. 5B shows steps of an example method for purging a volume between a substrate and a substrate support according to the present disclosure.

Referring now to FIG. 5B, an example method 540 for purging a volume above a substrate support according to the present disclosure begins at 544. For example only, the method 540 is performed during a cleaning or undercoat procedure. In other examples, the method 540 may be performed between processing steps performed on a same or different substrates, with the substrate arranged on the lift pad, etc. At 548, the substrate is transferred from (i.e., off of) a raised lift pad. At 552, a purge step is initiated. For example, the method 540 begins to supply a purge gas (e.g., at a flow rate of 90-110 sccm) to a volume below the substrate between the substrate and the substrate support. The purge gas is supplied via the lift pad as described above.

At 556, the method 540 performs a cleaning or undercoat procedure within the processing chamber. For example, in a cleaning procedure, the method 540 begins to supply cleaning gases to the processing chamber. Conversely, in an undercoat procedure, the method 540 begins to supply process gases for depositing an undercoat on the substrate support. The supply of purge gas prevents cleaning and undercoat gases from diffusing into the lift pad and the substrate support. At 560, the method 540 terminates the purge step. A substrate is arranged on the lift pad subsequent to terminating the purge step at 564. The method ends at 568.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for evacuating a volume below a substrate in a substrate processing system, the method comprising:
    arranging the substrate on a lift mechanism of a substrate support, wherein the lift mechanism is configured to be transitioned between raised and lowered positions relative to an upper surface of the substrate support and comprises a plurality of channels extending through a body of the lift mechanism or in and along a periphery of the lift mechanism, and wherein, when the substrate is arranged on the lift mechanism in the raised position, the volume below the substrate is defined between the substrate and the upper surface of the substrate support;
    initiating an evacuation step to evacuate the volume below the substrate, wherein the evacuation step includes operating a pump to pump down the volume below the substrate at least one of through and around the lift mechanism while the lift mechanism is being lowered to position the substrate on the upper surface of the substrate support;
    lowering the lift mechanism during the evacuation step to position the substrate on the upper surface of the substrate support; and
    terminating the evacuation step.

2. The method of claim 1, wherein the evacuation step is initiated in response to one of (i) the substrate being arranged on the lift mechanism and (ii) a beginning of the lowering of the lift mechanism.

3. The method of claim 1, wherein the evacuation step is initiated subsequent to the substrate being arranged on the lift mechanism and prior to a beginning of the lowering of the lift mechanism.

4. The method of claim 1, wherein the evacuation step and the lowering of the lift mechanism are initiated concurrently.

5. The method of claim 1, wherein the evacuation step is terminated in response to the lift mechanism reaching a fully lowered position.

6. The method of claim 1, wherein the evacuation step is terminated prior to the lift mechanism reaching a fully lowered position.

7. The method of claim 1, wherein the lift mechanism includes at least one channel defined in a shaft of the lift mechanism, and wherein pumping down the volume below the substrate includes evacuating the volume through the plurality of channels and downward through the substrate support.

8. The method of claim 1, wherein each of the plurality of channels includes a vertical portion and a radial portion defined in a lower surface of the lift mechanism.

9. The method of claim 1, wherein the lift mechanism includes at least one fluid passage defined in an upper surface of the lift mechanism, and wherein pumping down the volume below the substrate includes evacuating the volume through the at least one fluid passage and downward through the substrate support.

10. The method of claim 1, further comprising purging the volume below the substrate at least one of through and around the lift mechanism.

11. The method of claim 1, wherein the lift mechanism corresponds to one of a lift pad and lift pins.

12. A system for evacuating a volume below a substrate in a substrate processing system, the system comprising:
a substrate support;
a lift mechanism, wherein the lift mechanism is configured to be transitioned between raised and lowered positions relative to an upper surface of the substrate support and comprises a plurality of channels extending through a body of the lift mechanism or in and along a periphery of the lift mechanism, and wherein, when the substrate is arranged on the lift mechanism in the raised position, the volume below the substrate is defined between the substrate and the upper surface of the substrate support; and
a pump configured to, during an evacuation step, evacuate the volume below the substrate, wherein the evacuation step includes pumping down the volume below the substrate a least one of through and around the lift mechanism while the lift mechanism is being lowered to position the substrate on the upper surface of the substrate support,
wherein the lift mechanism corresponds to a lift pad.

13. The system of claim 12, wherein the pump is configured to initiate the evacuation step in response to one of (i) the substrate being arranged on the lift mechanism and (ii) a beginning of the lowering of the lift mechanism.

14. The system of claim 12, wherein the pump is configured to (i) initiate the evacuation step subsequent to the substrate being arranged on the lift mechanism and prior to a beginning of the lowering of the lift mechanism and (ii) terminate the evacuation step in response to the lift mechanism reaching a fully lowered position.

15. The system of claim 12, wherein the pump is configured to terminate the evacuation step is terminated prior to the lift mechanism reaching a fully lowered position.

16. The system of claim 12, wherein the lift mechanism includes at least one channel defined in a shaft of the lift mechanism, and wherein pumping down the volume below the substrate includes evacuating the volume through the at least one channel and downward through the substrate support.

17. A system for evacuating a volume below a substrate in a substrate processing system, the system comprising:
a substrate support;
a lift mechanism, wherein the lift mechanism is configured to be transitioned between raised and lowered positions relative to an upper surface of the substrate support, and wherein, when the substrate is arranged on the lift mechanism in the raised position, the volume below the substrate is defined between the substrate and the upper surface of the substrate support; and
a pump configured to, during an evacuation step, evacuate the volume below the substrate, wherein the evacuation step includes pumping down the volume below the substrate a least one of through and around the lift mechanism while the lift mechanism is being lowered to position the substrate on the upper surface of the substrate support,
wherein
the lift mechanism includes at least one channel defined in a shaft of the lift mechanism,
pumping down the volume below the substrate includes evacuating the volume through the at least one channel and downward through the substrate support,
the lift mechanism corresponds to a lift pad, and
the at least one channel includes a plurality of channels distributed around an outer perimeter of the shaft.

18. The system of claim 17, wherein each of the plurality of channels includes a vertical portion and a radial portion defined in a lower surface of the lift mechanism.

19. The system of claim 12, wherein the lift mechanism includes at least one fluid passage defined in an upper surface of the lift mechanism, and wherein pumping down the volume below the substrate includes evacuating the volume through the at least one fluid passage and downward through the substrate support.

20. The system of claim 12, wherein:
the upper surface is an uppermost surface of the substrate support;
the lift mechanism is configured to be transitioned between raised and lowered positions relative to the uppermost surface of the substrate support;
when the lift mechanism is in the raised position above the uppermost surface of the substrate support, the substrate is arranged on the lift mechanism and the evacuation step to evacuate the volume below the substrate is initiated; and
the volume below the substrate is defined as a volume extending from the substrate to the uppermost surface of the substrate support.

21. The system of claim 20, wherein the lift mechanism comprises a shaft having at least one of the plurality of channels for flow of gases to or from the volume below the substrate.

22. The system of claim 20, wherein the lift mechanism comprises a shaft having the plurality of channels for flow of gases to or from the volume below the substrate.

23. The system of claim 20, wherein the lift mechanism comprises the lift pad disposed on a shaft and comprising a plurality of fluid passages via which gases are evacuated during evacuation of the volume below the substrate.

* * * * *